United States Patent
Tsai et al.

(10) Patent No.: US 7,181,671 B2
(45) Date of Patent: Feb. 20, 2007

(54) PARALLELIZED CRC CALCULATION METHOD AND SYSTEM

(75) Inventors: Kovsky T. J. Tsai, Hsinchu (TW); Joe Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 525 days.

(21) Appl. No.: 10/667,510

(22) Filed: Sep. 23, 2003

(65) Prior Publication Data

US 2005/0066257 A1    Mar. 24, 2005

(51) Int. Cl.
*H03M 13/00* (2006.01)

(52) U.S. Cl. .................................... 714/757
(58) Field of Classification Search .............. 714/757
See application file for complete search history.

(56) References Cited

U.S. PATENT DOCUMENTS 5,103,451 A * 4/1992 Fossey ..................... 714/757
5,878,057 A * 3/1999 Maa ........................ 714/757
6,295,626 B1 * 9/2001 Nair et al. ................ 714/807
6,560,746 B1 * 5/2003 Mörsberger ............... 714/781

* cited by examiner

*Primary Examiner*—Shelly Chase
(74) *Attorney, Agent, or Firm*—Rabin & Berdo, P.C.

(57) ABSTRACT

A method and system for CRC calculation to an input message is provided while improving the process time and simple to implement. A linear mapping matrix corresponding to the LFSR to generate the CRC is planning, and the computation of the LFSR to the input message for the CRC generation becomes a simplified matrix multiplication. In the word-wise and doubleword-wise CRC32 cases, the input messages are padded with specific dummies before the prefix of the input message in accordance with their length types on the transmission side, or the CRC outputs derived from the received messages are compared with specific patterns in accordance with their length types on the reception side.

33 Claims, 9 Drawing Sheets

Scheme 1

Scheme 2

Fig. 1

Scheme 2

Scheme 1

Fig. 2

$$G = \begin{cases} \text{Row31} & \text{0x40000000} \\ \text{Row30} & \text{0x20000000} \\ \text{Row29} & \text{0x10000000} \\ \text{Row28} & \text{0x08000000} \\ \text{Row27} & \text{0x04000000} \\ \text{Row26} & \text{0x82000000} \\ \text{Row25} & \text{0x01000000} \\ \text{Row24} & \text{0x00800000} \\ \text{Row23} & \text{0x80400000} \\ \text{Row22} & \text{0x80200000} \\ \text{Row21} & \text{0x00100000} \\ \text{Row20} & \text{0x00080000} \\ \text{Row19} & \text{0x00040000} \\ \text{Row18} & \text{0x00020000} \\ \text{Row17} & \text{0x00010000} \\ \text{Row16} & \text{0x80008000} \\ \text{Row15} & \text{0x00004000} \\ \text{Row14} & \text{0x00002000} \\ \text{Row13} & \text{0x00001000} \\ \text{Row12} & \text{0x80000800} \\ \text{Row11} & \text{0x80000400} \\ \text{Row10} & \text{0x80000200} \\ \text{Row9} & \text{0x00000100} \\ \text{Row8} & \text{0x80000080} \\ \text{Row7} & \text{0x80000040} \\ \text{Row6} & \text{0x00000020} \\ \text{Row5} & \text{0x80000010} \\ \text{Row4} & \text{0x80000008} \\ \text{Row3} & \text{0x00000004} \\ \text{Row2} & \text{0x80000002} \\ \text{Row1} & \text{0x80000001} \\ \text{Row0} & \text{0x80000000} \end{cases}$$

$$G^{-1} = \begin{cases} \text{Row31} & \text{0x00000001} \\ \text{Row30} & \text{0x80000000} \\ \text{Row29} & \text{0x40000000} \\ \text{Row28} & \text{0x20000000} \\ \text{Row27} & \text{0x10000000} \\ \text{Row26} & \text{0x08000000} \\ \text{Row25} & \text{0x04000001} \\ \text{Row24} & \text{0x02000000} \\ \text{Row23} & \text{0x01000000} \\ \text{Row22} & \text{0x00800001} \\ \text{Row21} & \text{0x00400001} \\ \text{Row20} & \text{0x00200000} \\ \text{Row19} & \text{0x00100000} \\ \text{Row18} & \text{0x00080000} \\ \text{Row17} & \text{0x00040000} \\ \text{Row16} & \text{0x00020000} \\ \text{Row15} & \text{0x00010001} \\ \text{Row14} & \text{0x00008000} \\ \text{Row13} & \text{0x00004000} \\ \text{Row12} & \text{0x00002000} \\ \text{Row11} & \text{0x00001001} \\ \text{Row10} & \text{0x00000801} \\ \text{Row9} & \text{0x00000401} \\ \text{Row8} & \text{0x00000200} \\ \text{Row7} & \text{0x00000101} \\ \text{Row6} & \text{0x00000081} \\ \text{Row5} & \text{0x00000040} \\ \text{Row4} & \text{0x00000021} \\ \text{Row3} & \text{0x00000011} \\ \text{Row2} & \text{0x00000008} \\ \text{Row1} & \text{0x00000005} \\ \text{Row0} & \text{0x00000003} \end{cases}$$

$$T = G^8 = \begin{pmatrix} \text{Row31} & \text{0x20800000} \\ \text{Row30} & \text{0x90400000} \\ \text{Row29} & \text{0xc8200000} \\ \text{Row28} & \text{0x64100000} \\ \text{Row27} & \text{0xb2080000} \\ \text{Row26} & \text{0x59040000} \\ \text{Row25} & \text{0x0c020000} \\ \text{Row24} & \text{0x86010000} \\ \text{Row23} & \text{0x43008000} \\ \text{Row22} & \text{0x01004000} \\ \text{Row21} & \text{0x20002000} \\ \text{Row20} & \text{0x10001000} \\ \text{Row19} & \text{0x88000800} \\ \text{Row18} & \text{0xc4000400} \\ \text{Row17} & \text{0x62000200} \\ \text{Row16} & \text{0x31000100} \\ \text{Row15} & \text{0xb8000080} \\ \text{Row14} & \text{0xdc000040} \\ \text{Row13} & \text{0xee000020} \\ \text{Row12} & \text{0x77000010} \\ \text{Row11} & \text{0x1b000008} \\ \text{Row10} & \text{0x2d000004} \\ \text{Row9} & \text{0x36000002} \\ \text{Row8} & \text{0x1b000001} \\ \text{Row7} & \text{0xad000000} \\ \text{Row6} & \text{0xf6000000} \\ \text{Row5} & \text{0xfb000000} \\ \text{Row4} & \text{0x5d000000} \\ \text{Row3} & \text{0x8e000000} \\ \text{Row2} & \text{0xc7000000} \\ \text{Row1} & \text{0xc3000000} \\ \text{Row0} & \text{0x41000000} \end{pmatrix} \begin{matrix} 2 \\ 3 \\ 4 \\ 4 \\ 5 \\ 5 \\ 3 \\ 4 \\ 4 \\ 2 \\ 2 \\ 2 \\ 3 \\ 4 \\ 4 \\ 4 \\ 5 \\ 6 \\ 7 \\ 7 \\ 5 \\ 5 \\ 5 \\ 5 \\ 5 \\ 6 \\ 7 \\ 5 \\ 4 \\ 5 \\ 4 \\ 2 \end{matrix}$$

$$T^{-1} = G^{-8} = \begin{pmatrix} \text{Row31} & \text{0x000000d5} \\ \text{Row30} & \text{0x0000006a} \\ \text{Row29} & \text{0x00000035} \\ \text{Row28} & \text{0x0000001a} \\ \text{Row27} & \text{0x0000000d} \\ \text{Row26} & \text{0x00000006} \\ \text{Row25} & \text{0x000000d6} \\ \text{Row24} & \text{0x0000006b} \\ \text{Row23} & \text{0x80000035} \\ \text{Row22} & \text{0x400000cf} \\ \text{Row21} & \text{0x200000b2} \\ \text{Row20} & \text{0x10000059} \\ \text{Row19} & \text{0x0800002c} \\ \text{Row18} & \text{0x04000016} \\ \text{Row17} & \text{0x0200000b} \\ \text{Row16} & \text{0x01000005} \\ \text{Row15} & \text{0x008000d7} \\ \text{Row14} & \text{0x0040006b} \\ \text{Row13} & \text{0x00200035} \\ \text{Row12} & \text{0x0010001a} \\ \text{Row11} & \text{0x000800d8} \\ \text{Row10} & \text{0x000400b9} \\ \text{Row9} & \text{0x00040089} \\ \text{Row8} & \text{0x00020044} \\ \text{Row7} & \text{0x000080f7} \\ \text{Row6} & \text{0x000040ae} \\ \text{Row5} & \text{0x00002057} \\ \text{Row4} & \text{0x000010fe} \\ \text{Row3} & \text{0x000008aa} \\ \text{Row2} & \text{0x00000455} \\ \text{Row1} & \text{0x000002ff} \\ \text{Row0} & \text{0x000001aa} \end{pmatrix} \begin{matrix} 5 \\ 4 \\ 4 \\ 3 \\ 3 \\ 2 \\ 5 \\ 5 \\ 5 \\ 7 \\ 5 \\ 5 \\ 4 \\ 4 \\ 4 \\ 3 \\ 7 \\ 6 \\ 5 \\ 4 \\ 5 \\ 6 \\ 4 \\ 3 \\ 8 \\ 6 \\ 6 \\ 8 \\ 5 \\ 5 \\ 9 \\ 5 \end{matrix}$$

Fig. 5

$$T = G^{16} = \begin{cases} \text{Row31} & \text{0x8b208000} & 6 \\ \text{Row30} & \text{0x45904000} & 6 \\ \text{Row29} & \text{0x22c82000} & 6 \\ \text{Row28} & \text{0x11641000} & 6 \\ \text{Row27} & \text{0x08b20800} & 6 \\ \text{Row26} & \text{0x04590400} & 6 \\ \text{Row25} & \text{0x890c0200} & 6 \\ \text{Row24} & \text{0x44860100} & 6 \\ \text{Row23} & \text{0xa2430080} & 7 \\ \text{Row22} & \text{0x5a010040} & 6 \\ \text{Row21} & \text{0x26200020} & 5 \\ \text{Row20} & \text{0x13100010} & 5 \\ \text{Row19} & \text{0x89880008} & 6 \\ \text{Row18} & \text{0xc4c40004} & 7 \\ \text{Row17} & \text{0x62620002} & 7 \\ \text{Row16} & \text{0x31310001} & 7 \\ \text{Row15} & \text{0x93b80000} & 8 \\ \text{Row14} & \text{0xc9dc0000} & 9 \\ \text{Row13} & \text{0x64ee0000} & 9 \\ \text{Row12} & \text{0xb2770000} & 10 \\ \text{Row11} & \text{0xd21b0000} & 8 \\ \text{Row10} & \text{0x622d0000} & 7 \\ \text{Row9} & \text{0x3a360000} & 8 \\ \text{Row8} & \text{0x1d1b0000} & 8 \\ \text{Row7} & \text{0x85ad0000} & 8 \\ \text{Row6} & \text{0x49f60000} & 9 \\ \text{Row5} & \text{0x24fb0000} & 9 \\ \text{Row4} & \text{0x995d0000} & 9 \\ \text{Row3} & \text{0xc78e0000} & 9 \\ \text{Row2} & \text{0x63c70000} & 9 \\ \text{Row1} & \text{0x3ac30000} & 8 \\ \text{Row0} & \text{0x16410000} & 5 \end{cases}$$

$$T^{-1} = G^{-16} = \begin{cases} \text{Row31} & \text{0x0000d558} & 8 \\ \text{Row30} & \text{0x00006aac} & 8 \\ \text{Row29} & \text{0x00003556} & 8 \\ \text{Row28} & \text{0x00001aab} & 8 \\ \text{Row27} & \text{0x00000d55} & 7 \\ \text{Row26} & \text{0x000006aa} & 6 \\ \text{Row25} & \text{0x0000d60d} & 8 \\ \text{Row24} & \text{0x00006b06} & 7 \\ \text{Row23} & \text{0x00003583} & 7 \\ \text{Row22} & \text{0x0000cf99} & 10 \\ \text{Row21} & \text{0x0000b294} & 7 \\ \text{Row20} & \text{0x0000594a} & 7 \\ \text{Row19} & \text{0x00002ca5} & 7 \\ \text{Row18} & \text{0x00001652} & 6 \\ \text{Row17} & \text{0x00000b29} & 6 \\ \text{Row16} & \text{0x00000594} & 5 \\ \text{Row15} & \text{0x8000d792} & 10 \\ \text{Row14} & \text{0x40006bc9} & 10 \\ \text{Row13} & \text{0x200035e4} & 9 \\ \text{Row12} & \text{0x10001af2} & 9 \\ \text{Row11} & \text{0x0800d821} & 7 \\ \text{Row10} & \text{0x0400b948} & 8 \\ \text{Row9} & \text{0x040089fc} & 10 \\ \text{Row8} & \text{0x010044fe} & 10 \\ \text{Row7} & \text{0x0080f727} & 12 \\ \text{Row6} & \text{0x0040aecb} & 11 \\ \text{Row5} & \text{0x00205765} & 10 \\ \text{Row4} & \text{0x0010feea} & 13 \\ \text{Row3} & \text{0x0008aa2d} & 9 \\ \text{Row2} & \text{0x00045516} & 8 \\ \text{Row1} & \text{0x0002ffd3} & 14 \\ \text{Row0} & \text{0x0001aab1} & 9 \end{cases}$$

$$T = G^{32} = \begin{pmatrix} \text{Row31} & \text{0xfb808b20} & 13 \\ \text{Row30} & \text{0x7dc04590} & 13 \\ \text{Row29} & \text{0xbee022c8} & 14 \\ \text{Row28} & \text{0x5f701164} & 14 \\ \text{Row27} & \text{0x2fb808b2} & 14 \\ \text{Row26} & \text{0x97dc0459} & 15 \\ \text{Row25} & \text{0xb061890c} & 13 \\ \text{Row24} & \text{0x58374486} & 13 \\ \text{Row23} & \text{0xac1ba243} & 14 \\ \text{Row22} & \text{0xad8d5a01} & 14 \\ \text{Row21} & \text{0xad462620} & 12 \\ \text{Row20} & \text{0x56a31310} & 12 \\ \text{Row19} & \text{0x2b518988} & 12 \\ \text{Row18} & \text{095a8xc4c4} & 13 \\ \text{Row17} & \text{0xcad46262} & 14 \\ \text{Row16} & \text{0x656a3131} & 14 \\ \text{Row15} & \text{0x493593b8} & 15 \\ \text{Row14} & \text{0x249ac9dc} & 15 \\ \text{Row13} & \text{0x924d64ee} & 16 \\ \text{Row12} & \text{0xc926b277} & 17 \\ \text{Row11} & \text{0x9f13d21b} & 17 \\ \text{Row10} & \text{0xb409622d} & 13 \\ \text{Row9} & \text{0x21843a36} & 12 \\ \text{Row8} & \text{0x90c21d1b} & 13 \\ \text{Row7} & \text{0x33e185ad} & 16 \\ \text{Row6} & \text{0x627049f6} & 15 \\ \text{Row5} & \text{0x313824fb} & 15 \\ \text{Row4} & \text{0xe31c995d} & 17 \\ \text{Row3} & \text{0x8a0ec78e} & 15 \\ \text{Row2} & \text{0xc50763c7} & 16 \\ \text{Row1} & \text{0x19033ac3} & 13 \\ \text{Row0} & \text{0xf7011641} & 13 \end{pmatrix}$$

$$T^{-1} = G^{-32} = \begin{pmatrix} \text{Row31} & \text{0xd558a113} & 14 \\ \text{Row30} & \text{0x6aac5089} & 13 \\ \text{Row29} & \text{0x35562844} & 12 \\ \text{Row28} & \text{0x1aab1422} & 12 \\ \text{Row27} & \text{0x0d558a11} & 12 \\ \text{Row26} & \text{0x06aac508} & 11 \\ \text{Row25} & \text{0xd60dc397} & 17 \\ \text{Row24} & \text{0x6b06e1cb} & 16 \\ \text{Row23} & \text{0x358370e5} & 15 \\ \text{Row22} & \text{0xcf991961} & 16 \\ \text{Row21} & \text{0xb2942da3} & 15 \\ \text{Row20} & \text{0x594a16d1} & 14 \\ \text{Row19} & \text{0x2ca50b68} & 13 \\ \text{Row18} & \text{0x165285b4} & 13 \\ \text{Row17} & \text{0x0b2942da} & 13 \\ \text{Row16} & \text{0x0594a16d} & 13 \\ \text{Row15} & \text{0xd792f1a5} & 18 \\ \text{Row14} & \text{0x6bc978d2} & 17 \\ \text{Row13} & \text{0x35e4bc69} & 17 \\ \text{Row12} & \text{0x1af25e34} & 16 \\ \text{Row11} & \text{0xd8218e09} & 12 \\ \text{Row10} & \text{0xb9486617} & 15 \\ \text{Row9} & \text{0x89fc9218} & 14 \\ \text{Row8} & \text{0x44fe490c} & 14 \\ \text{Row7} & \text{0xf7278595} & 18 \\ \text{Row6} & \text{0xaecb63d9} & 19 \\ \text{Row5} & \text{0x5765b1ec} & 18 \\ \text{Row4} & \text{0xfeea79e5} & 22 \\ \text{Row3} & \text{0xaa2d9de1} & 17 \\ \text{Row2} & \text{0x5516cef0} & 16 \\ \text{Row1} & \text{0xffd3c66b} & 22 \\ \text{Row0} & \text{0xaab14226} & 13 \end{pmatrix}$$

PARALLELIZED CRC CALCULATION METHOD AND SYSTEM

FIELD OF THE INVENTION

The present invention relates generally to a parallelized CRC calculation method and system, and, more particularly, to a method and system for applications of generating and checking CRC32, especially for the Frame Check Sequence (FCS) systems.

BACKGROUND OF THE INVENTION

Cyclic redundancy code (CRC) has been used for a long time to preserve the integrity of digital data in storage and transmission systems. More particularly, CRC is an important error detection tool used for communications and data processing applications. The CRC schemes are often used for checking integrity of data because they are easy to implement and they detect a large class of errors. CRC is a kind of checksum which is transmitted with data between a source node and a target node over a communications medium. The source node calculates the CRC for the data to be transferred using a predetermined polynomial and then transmits the data along with the CRC to the target node where the CRC of the received data is independently generated using the predetermined generator polynomial and compared with the CRC received from the source node to check if errors have occurred during the transmission. Treating the data or message as a binary polynomial, its CRC corresponding to a particular generator polynomial may be generated by raising the message polynomial to a proper power first and then taking the remainder of the message polynomial divided by the generator polynomial. For CRC generation, data bits are typically serially inputted into a CRC generator in order to produce the appropriate CRC code for transmission along with the data. Traditionally, CRC codes are generated with Linear Feedback Shift Register (LFSR) circuits. An LFSR takes the input data and shifts through a series of flip-flops on successive clock cycles. Combinations of the shift register output and data input are fed back to the flip-flops via exclusive-OR gates. An LFSR can be defined in terms of a generator polynomial which relates the input data and the CRC code via a polynomial expression and of which "+" is an exclusive-OR operation. The state of the flip-flops upon completion of the shifting process is the CRC code.

For example, ATM uses a FCS field derived from CRC error detection codes for error checking. The integrity of the transmitted or processed message in an ATM system is ensured by the addition at the end of the message of the FCS traveling with the message itself so it can be checked on the reception side for proper transmission. The FCS code has been standardized for data integrity checking as described in the ANSI X3.139-1987 document pages 28 and 29. All the CRC codes constitute a finite Galois Field (GF), and the CRC32 codes belong to the GF generated by the following generator polynomial of degree 32:

$$g(x)=x^{32}+x^{26}+x^{23}+x^{22}+x^{16}+x^{12}+x^{11}+x^{10}+x^8+x^7+x^5+x^4+x^2+x+1$$

This generator polynomial of degree 32 was chosen as a standard for error checking in Ethernet and then chosen by the ATM standard for AAL5 error checking. In the circuitry for calculating the FCS or checking the message, an LFSR carries out a bit by bit multiplication in the GF, i.e., modulo the polynomial on which GF is generated, and by which each bit of the message is inputted into the LFSR in the manner of most significant bit (MSB) first and division is performed by feedbacks. At the end of the process, the FCS, i.e., the remainder of the division, is within the shift registers.

Hardware implementation for CRC generators in large scale digital systems is preferred because it is faster. The drawback of hardware implementation of CRCs is that more hardware is required with consequent increase in cost, size and complexity and a decrease in reliability. Software implemented CRCs are known although their use is not widespread because of the speed penalty thought to be inevitable. Those skilled in the art understand that choosing a polynomial of a larger degree will result in greater error detection. However, for the applications of current large scale systems, the desired hardware becomes too complicated and costly to be implemented and the required software needs huge computations. Several improvements were made for CRC generators. For example, by using CRC routines to generate tables consisting of all possible combinations of the chosen polynomial, the checksum generation is reduced to a table lookup. These CRC routines are considered to be the fastest software implementations available, but they take up a great deal of dedicated memory. Early CRC implementations use the concept of LFSR in which the polynomial division is processed one bit at a time. However, the serial processing for the generation of the CRC is relatively slow, and as the technology advanced, single-bit CRC generation was not enough to handle high-speed data processing and transmission, and parallel CRC algorithms were then developed to meet this need. The key reason that existing CRC algorithms are limited in their degree of parallelism is deeply rooted in the concept of LFSRs. All existing algorithms try to solve the same problem, i.e., how to parallelize the bit-by-bit operation of LFSRs. As a result, the degree of parallelism never goes beyond the perceived size of LFSRs.

Accordingly, it is desired a parallelized CRC calculation method and system to reduce the processing for generation of CRC codes.

SUMMARY OF THE INVENTION

The present invention is directed to a methodology to simplify the CRC calculation, by which the process for the CRC generation is speeded up and the circuitry for the system is simplified.

To simplify the CRC calculation, according to the present invention, a linear mapping matrix corresponding to the LFSR to generate the CRC is planning and thus the computation of the LFSR to the input message for the CRC generation becomes a simplified matrix multiplication. Various linear mapping matrixes are provided for the processed message inputted in byte-wise, word-wise and doubleword-wise forms. In addition, the input messages are padded with specific dummies on the transmission side or the CRC outputs on the reception side are compared with specific patterns in accordance with their length types for the word-wise and doubleword-wise CRC32 cases.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Cyclic Code in a Systematic Form

As is well-known, an (n, k) linear code C is called a cyclic code if every cyclic shift of a code vector in C is also a code vector in C. To figure out a cyclic code in a systematic form on the transmission side, let the message to be encoded is $$M = (m_{k-1} \ldots m_1 m_0)^T, \quad (\text{EQ-1})$$

and the corresponding message polynomial is $$m(x) = m_0 x^{k-1} + m_1 x^{k-2} + \ldots + m_{k-2} x + m_{k-1}. \quad (\text{EQ-2})$$

After multiplying m(x) by $x^{n-k}$, equation EQ-2 becomes $$x^{n-k} m(x) = m_0 x^{n-1} + m_1 x^{n-2} + \ldots + m_{k-2} x^{n-k+1} + m_{k-1} x^{n-k}. \quad (\text{EQ-3})$$

Then, $x^{n-k}m(x)$ is divided by the generator polynomial g(x), and it becomes $$x^{n-k} m(x) = q(x) g(x) + r(x). \quad (\text{EQ-4})$$

By rearranging equation EQ-4 and inversing the sign of the remainder to replace the original one, it will be obtained the codeword polynomial $$x^{n-k} m(x) + r(x) = q(x) g(x). \quad (\text{EQ-5})$$

Obviously, this codeword polynomial is divisible by the generator polynomial g(x).

From the above description, it can be summarized that a cyclic encoding in a systematic form includes:

Step 1. Multiplying the message m(x) by $x^{n-k}$;

Step 2. Deriving the remainder r(x) by dividing $x^{n-k}m(x)$ by the generator polynomial g(x); and Step 3. Combining r(x) with $x^{n-k}m(x)$ to obtain the codeword polynomial $x^{n-k}m(x)+r(x)$.

Likewise, in order to check the integrity of the received codeword on the reception side, it is verified if the received sequence is divisible by the generator polynomial g(x).

Shortened Cyclic Codes

Given an (n, k) cyclic code C, if the set of the code vectors for which the l leading high-order information digits are identical to zero, then there are $2^{k-l}$ such code vectors and they form a linear subcode of C. If the l zero information digits are deleted, it is obtained a set of $2^{k-l}$ vectors of length n−l. These shortened vectors form an (n−l, k−l) linear code, and which code is called a shortened cyclic code and is not cyclic.

Implementation of Divisor

No matter for a cyclic code encoding or decoding, a divisor of Galois Field GF(2) is needed. For example, a simple Linear Feedback Shift Register (LFSR) is employed to implement the divisor. Furthermore, depending on the dividend sequence shifted into LFSR either from MSB side or Least Significant Bit (LSB) side, there are two schemes for implementation of a divisor, i.e., Scheme 1: Message is shifted into LFSR from MSB side, which is mathematically equivalent to $$m(x) x^{n-k} \bmod g(x) \quad (\text{EQ-6})$$

Scheme 2: Message is shifted into LFSR from LSB side, which is mathematically equivalent to $$m(x) \bmod g(x) \quad (\text{EQ-7})$$

Figure 1:
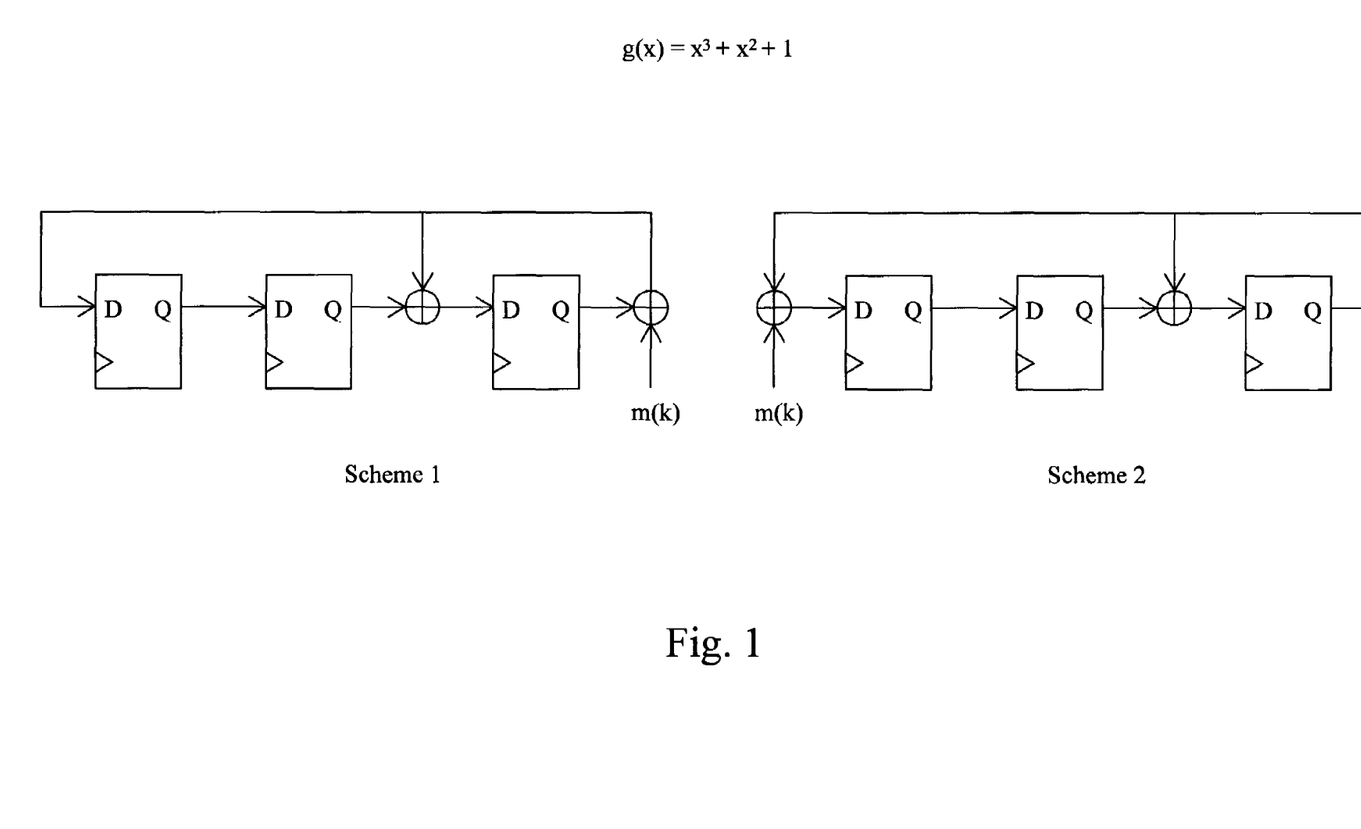
FIG. 1 shows two schemes for a generator polynomial with message shifted into LFSR from MSB and LSB sides, respectively.

For illustration, two circuitries are shown in FIG. 1 for these two schemes for the generator polynomial $g(x) = x^3 + x^2 + 1$.

Linear Mapping

Figure 2:
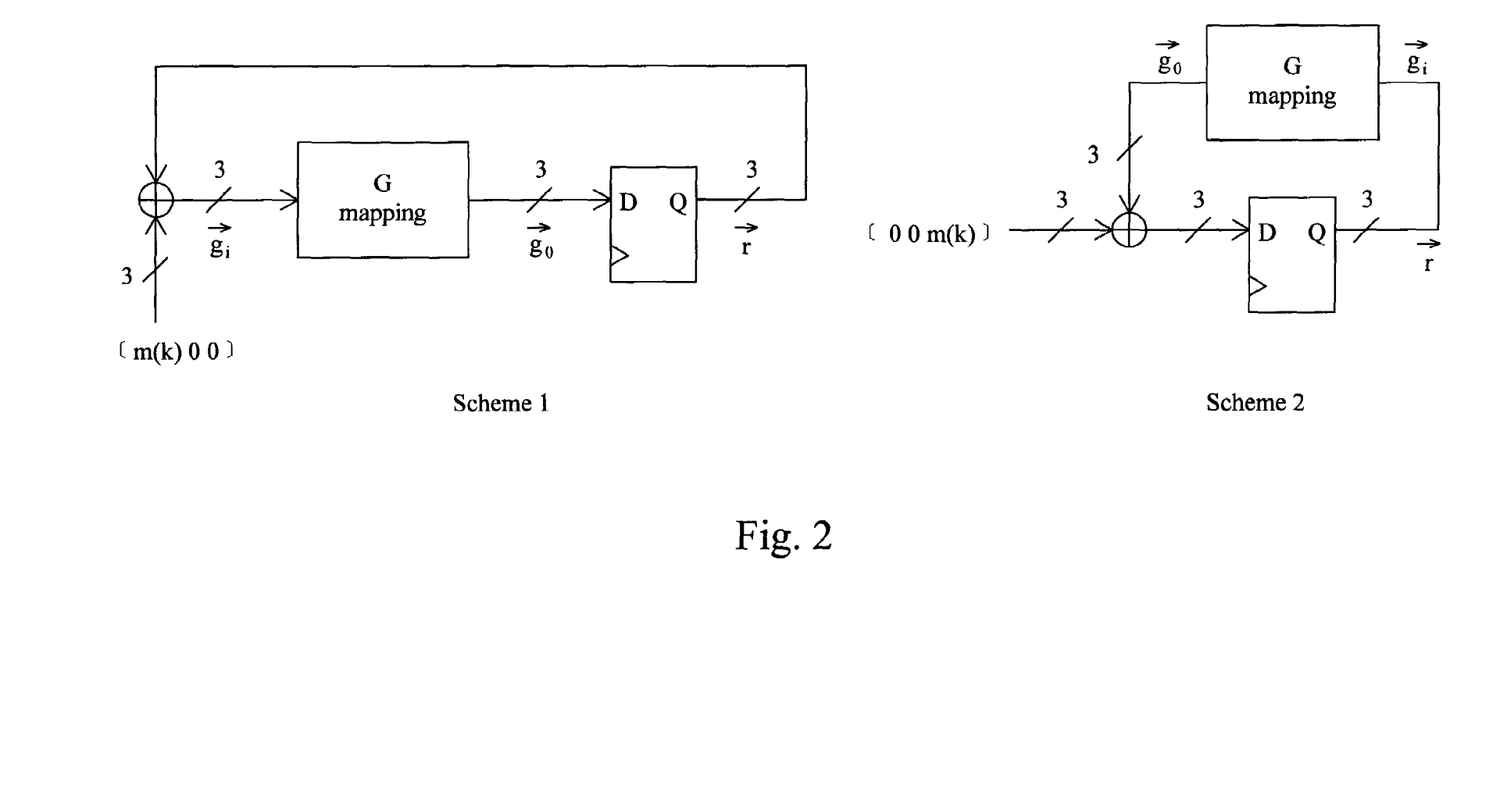
FIG. 2 shows two schemes linearly mapped from those of FIG. 1.

Further, the linear feedback shift registers shown in FIG. 1 can be regarded as a linear mapping mathematically, as shown in FIG. 2. For the same generator polynomial $g(x) = x^3 + x^2 + 1$, it can be derived the G mapping:

$$g_o(2) = g_i(2) \oplus g_i(1), \quad (\text{EQ-8a})$$

$$g_o(1) = g_i(0), \text{ and} \quad (\text{EQ-8b})$$

$$g_o(0) = g_i(2) \quad (\text{EQ-8c})$$

and this linear mapping can be represented in a matrix form as $$\begin{bmatrix} g_o(2) \\ g_o(1) \\ g_o(0) \end{bmatrix} = G \begin{bmatrix} g_i(2) \\ g_i(1) \\ g_i(0) \end{bmatrix} \quad (\text{EQ-9})$$

where $$G = \begin{bmatrix} 0 & 1 & 0 \\ 1 & 0 & 1 \\ 1 & 0 & 0 \end{bmatrix} \quad (\text{EQ-10})$$

and trivially, the matrix G is invertible and its inverse matrix is $$G^{-1} = \begin{bmatrix} 0 & 0 & 1 \\ 1 & 0 & 0 \\ 0 & 1 & 1 \end{bmatrix} \quad (\text{EQ-11})$$

Based on the Scheme 1 and 2, there exist recursive equations between the output of the D-type flip-flops of the polynomial generator g(x) and the input of the encoded message, respectively, as Scheme 1:

$$R(k) = G(R(k-1) + M(k-1)), \text{ and} \quad (\text{EQ-12})$$

Scheme 2:

$$R(k) = GR(k-1) + M(k-1). \quad (\text{EQ-13})$$

Further tracing the output of the D-type flip-flops, i.e., the remainder of a division, in Scheme 1, it results in $$R(0) = I, \quad \text{(EQ-14a)}$$

$$R(1) = G(R(0) + M(0)) = GI + GM, \quad \text{(EQ-14b)}$$

$$R(2) = G(R(1) + M(1)) \quad \text{(EQ-14c)}$$

$$= G^2I + G^2M(0) + GM(1),$$

...

$$R(k) = G(R(k-1) + M(k-1)) \quad \text{(EQ-14d)}$$

$$= G^kI + G^kM(0) + G^{k-1}M(1) + \ldots + GM(k-1)$$

Generation of FCS

In Standard 802.3, the CRC32 is employed to generate FCS and the generator polynomial is $$g(x) = x^{32} + x^{26} + x^{23} + x^{22} + x^{16} + x^{12} + x^{11} + x^{10} + x^8 + x^7 + x^5 + x^4 + x^2 + x + 1. \quad \text{(EQ-15)}$$

Mathematically, the CRC value corresponding to a given frame is defined by the following procedures:
a.) The first 32 bits of the frame are complemented;
b.) The k bits of the frame are then considered to be the coefficients of a polynomial m(x) of degree k−1;
c.) m(x) is multiplied by $X^{32}$ and divided by g(x), producing a remainder r(x) of degree less than or equal to 31;
d.) The coefficients of r(x) are considered to be a 32-bit sequence; and
e.) The bit sequence is complemented and the result is the FCS f(x).

In the procedure a, disclosed are two implementation methods:
Method 1: complementing the first 32 bits of the message directly; and
Method 2: initiating the D-type flip-flop with 1 specific value, e.g., 0xffffffff for the Scheme 1 and 0x46af6449 for the Scheme 2.

Figure 3:
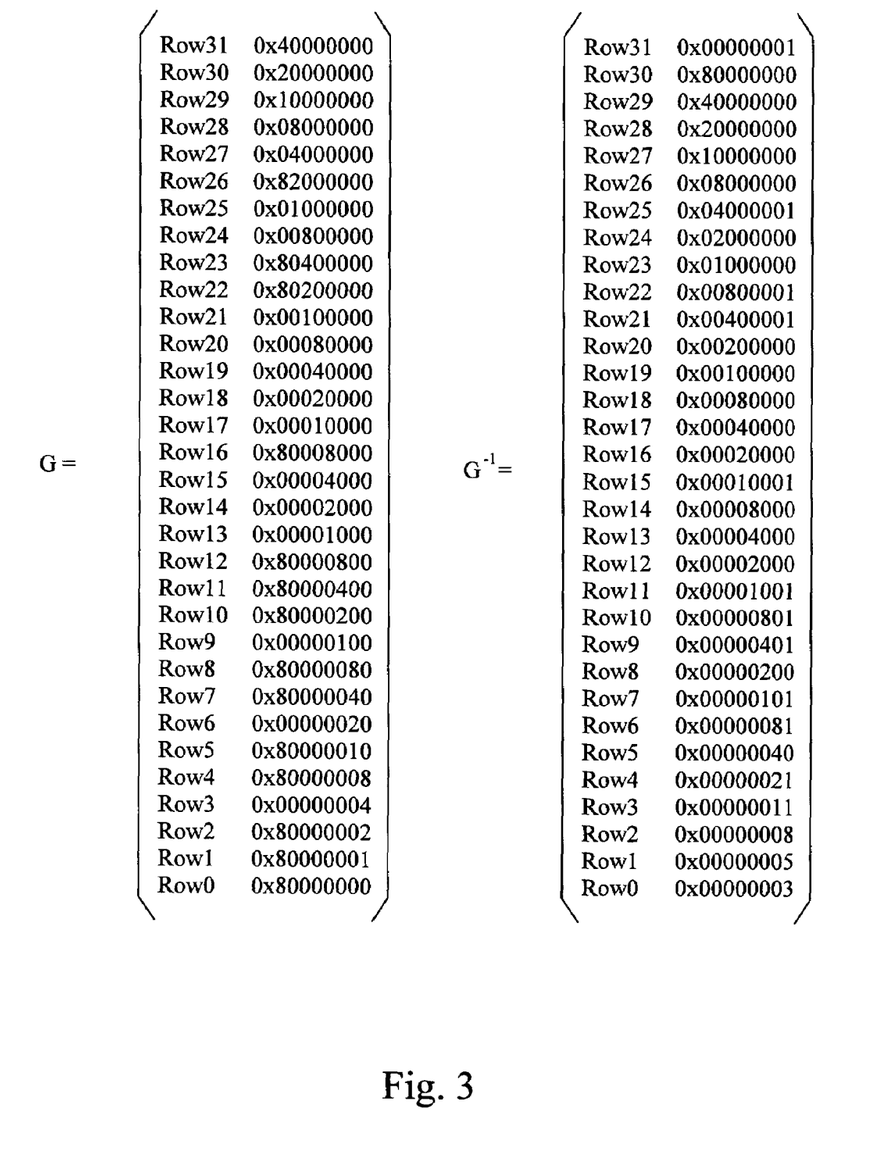
FIG. 3 shows the mapping matrix and its inverse for CRC32 generations.

The mapping matrix G and its inverse matrix $G^{-1}$ are shown in FIG. 3.

On the reception side, when the whole of frame is acquired, the output of the Scheme 1 CRC checker is compared with the value of 0xc704dd7b to examine the integrity of the received frame. The reason is explained herewith.

Let the transmitted message (except for FCS) is represented in a polynomial form $$m(x) = m_0 x^{k-1} + m_1 x^{k-2} + \ldots + m_{k-2} x + m_{k-1}, \quad \text{(EQ-16)}$$

and defining a polynomial c(x) of degree 31 with all of its coefficients to be $$c(x) = 1x^{31} + 1x^{30} + \ldots + 1x^2 + 1x + 1, \quad \text{(EQ-17)}$$

then the remainder r(x) generated by the procedure c will be $$r(x) = (m(x) + c(x)x^{k-32})x^{32} \bmod g(x). \quad \text{(EQ-18)}$$

After performing procedures d to e, it will generate FCS and the transmitted sequences $$f(x) = \overline{r(x)}, \text{ and} \quad \text{(EQ-19)}$$

$$n(x) = m(x)x^{32} + f(x) \quad \text{(EQ-20)}$$

On the reception side, if the integrity of this frame sequence is maintained, then the remainder of a division will be $$s(x) = (n(x) + c(x)x^k)x^{32} \bmod g(x) \quad \text{(EQ-21)}$$

$$= (m(x)x^{32} + f(x) + c(x)x^k)x^{32} \bmod g(x)$$

$$= (m(x)x^{32} + c(x)x^k + f(x))x^{32} \bmod g(x)$$

From equation EQ-18, equation EQ-21 can be further modified to be $$s(x) = (q(x)g(x) + r(x) + f(x))x^{32} \bmod g(x) \quad \text{(EQ-22)}$$

$$= (r(x) + f(x))x^{32} \bmod g(x)$$

$$= c(x)x^{32} \bmod g(x)$$

$$= [0xc704dd7b][x^{31} \ldots x^1 \ 1]$$

Based on a similar derivation, it can be further obtained, if the Scheme 2 is adopted, that the checking pattern will be the value of 0xffffffff.

Parallelized CRC Calculation

So far the encoding message is sequentially inputted to the CRC calculation with one bit each time, however, for high-speed applications, CRC calculation is desired for the capability of multiple message bits inputted, e.g., byte-wise, at a time to increase the throughput. Consequently, the principal architecture of the previous proposed two schemes is maintained and there is only somewhat difference at the mapping matrix.

Let the input message and the status of the flip-flops be represented, respectively, with a vector form as $$M(k) = [m_k \ 0 \ \ldots \ 0]^T, \text{ and} \quad \text{(EQ-23)}$$

$$R(k) = [r_k^{31} \ r_k^{30} \ \ldots \ r_k^0]^T. \quad \text{(EQ-24)}$$

Tracing the R(k) influenced by the values of M(k), initially, $R(0) = 0$, \quad (EQ-25a)

then, $R(1) = G(R(0) + M(0)) = GM(0)$, and \quad (EQ-25b)

$R(2) = G(R(1) + M(1)) = G^2M(0) + GM(1)$. \quad (EQ-25c)

It can be further verified $G^2M(0) = m_0 \times$ the 1st column of the $G^2$ matrix, and \quad (EQ-26a)

$GM(1) = m_1 \times$ the 1st column of the G matrix. \quad (EQ-26b)

Defining a new vector with l(≦32) non-zero entries as $$M_l(k) = [m_k^{l-1} \ m_k^{l-2} \ \ldots \ m_k^0 \ 0 \ \ldots \ 0]^T \quad \text{(EQ-27a)}$$

$$= [m_{k*l} \ m_{k*l+1} \ \ldots \ m_{k*l+l-1} \ 0 \ \ldots \ 0]^T \quad \text{(EQ-27b)}$$

When l=2 and k=0, it becomes $$M_2(0) = [m_0 \ m_1 \ \ldots \ 0 \ \ldots \ 0]^T, \quad \text{(EQ-28)}$$

and it is further derived $G^2M_2(0) = m_0 \times$ the 1st column of the $G^2$ matrix $+ m_1 \times$ the 2nd column of the $G^2$ matrix \quad (EQ-29)

Examining the property of the G matrix, it can be found the 1st column of the $G$ matrix=the 2nd column of the $G^2$ matrix. (EQ-30)

Hence, it is obtained $$G^2M_2(0)=G^2M(0)+GM(1) \quad \text{(EQ-31)}$$

and it is further included that $$G^lM_l(0)=G^lM(0)+G^{l-1}M(1)+\ldots+GM(l-1), \text{ for } l\leq 32. \quad \text{(EQ-32)}$$

Byte-Wise CRC32

When the message is inputted in byte-wise form at a time, the input message and calculated remainder vectors are represented as $$M_8(k)=[m_k^7\ m_k^6 \ldots m_k^0\ 0 \ldots 0]_{1\times 32}^T \quad \text{(EQ-33)}$$

$$R(k)=[r_k^{31}\ r_k^{30} \ldots r_k^0]_{1\times 32}^T \quad \text{(EQ-34)}$$

Figure 4:
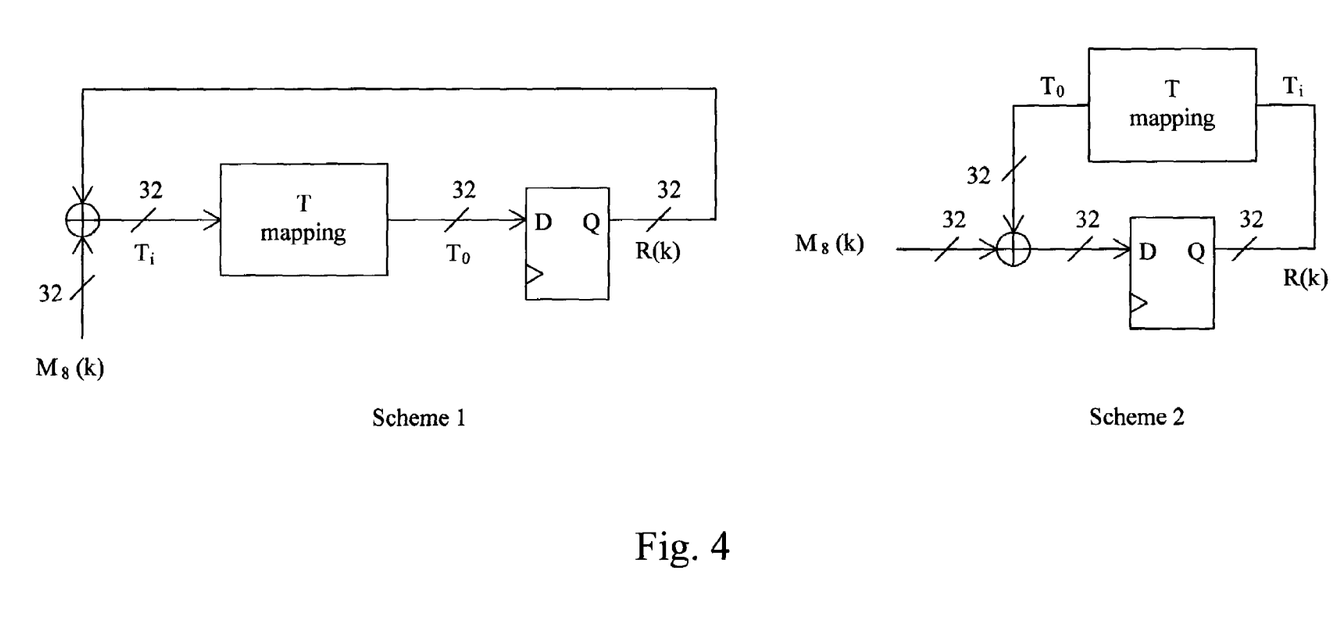
FIG. 4 shows the circuitries for byte-wise CRC32 generations.

If the Scheme 1 is adopted, the recursive equation of the input message and calculated remainder is $$R(k+1)=T(R(k)+M_8(k)), \quad \text{(EQ-35)}$$

and the circuitry is shown in FIG. 4.

Likewise, if the Scheme 2 is adopted, the recursive equation will be $$R(k+1)=TR(k)+M_8(k) \quad \text{(EQ-36)}$$

and its circuitry is also shown in FIG. 4.

Figure 5:
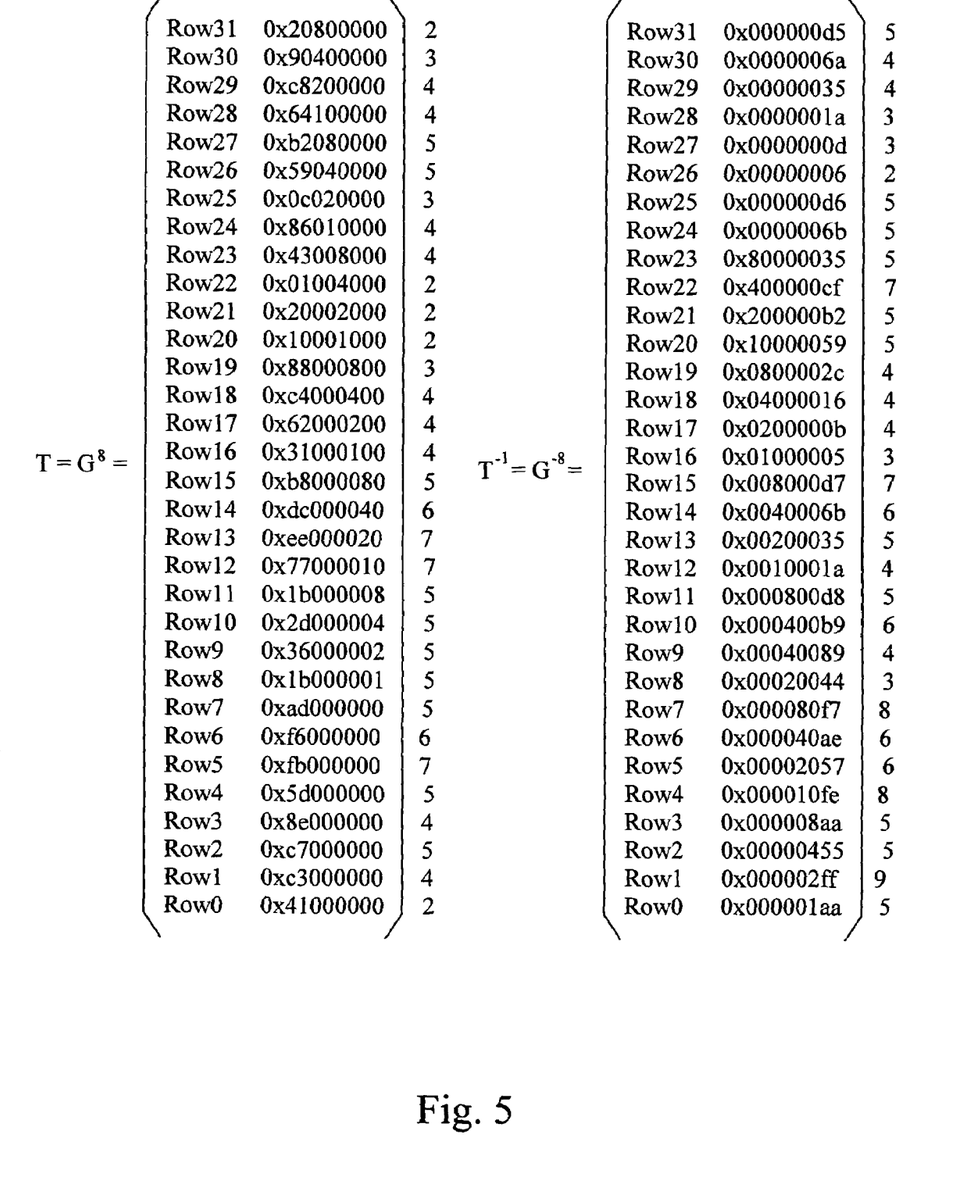
FIG. 5 shows the mapping matrix and its inverse for byte-wise CRC32 generations.

For equation EQ-35 and 36, the mapping matrix T and its inverse are shown in FIG. 5, and of which, the number on the right-hand side of each row indicates how many nonzero entries that row has. For example, in the matrix T, Row 1 has 4 nonzero entries and those rows with maximum nonzero entries, the value of 7, are Row 5, 12 and 13.

Word-Wise CRC32

When the message is inputted in word-wise form at a time, the input message and calculated remainder vectors are $$M_{16}(k)=[m_k^{15}\ m_k^{14} \ldots m_k^0\ 0 \ldots 0]_{1\times 32}^T \quad \text{(EQ-37)}$$

$$R(k)=[r_k^{31}\ r_k^{30} \ldots r_k^0]_{1\times 32}^T \quad \text{(EQ-38)}$$

Figure 6:
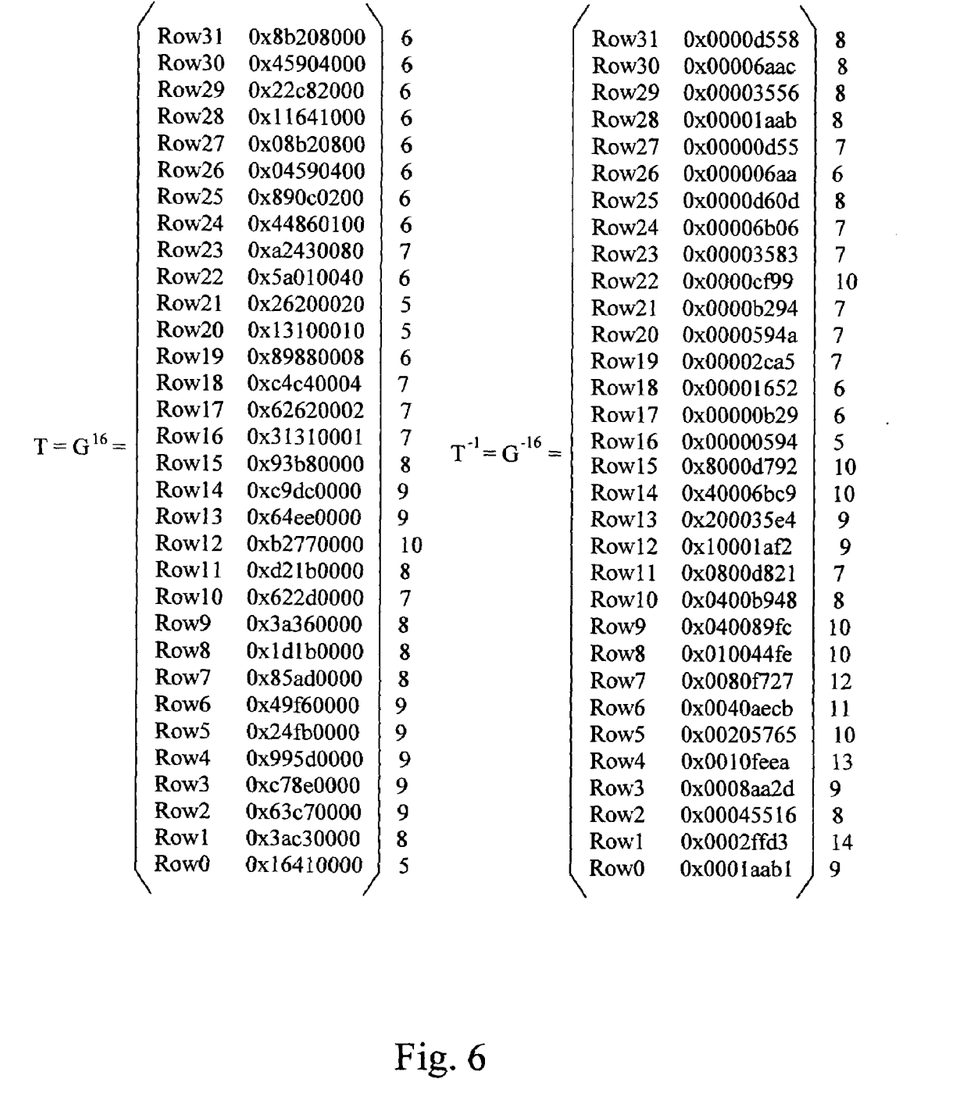
FIG. 6 shows the mapping matrix and its inverse for word-wise CRC32 generations.
Figure 7:
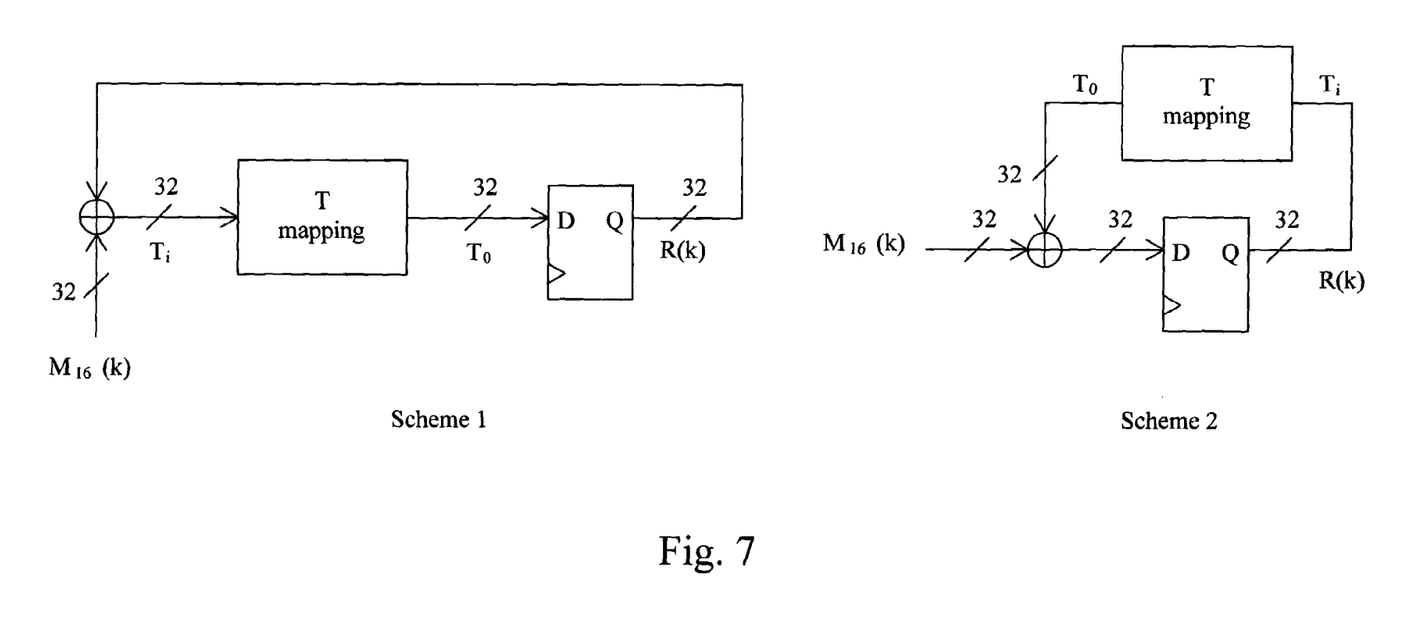
FIG. 7 shows the circuitries for word-wise CRC32 generations.

Similar to the situations for the byte-wise form, the recursive equations for the Scheme 1 and 2 are $$R(k+1)=T(R(k)+M_{16}(k)) \text{ for Scheme 1, and} \quad \text{(EQ-39)}$$

$$R(k+1)=TR(k)+M_{16}(k) \text{ for Scheme 2}, \quad \text{(EQ-40)}$$

and for which, the matrix T and its inverse $T^{-1}$ are shown in FIG. 6, and their circuitries are shown in FIG. 7.

However, the MAC frame is based on octet format, and the length of the processed message is not always divisible by 2. As a result, some dummies are padded on the message in order to have the word-wise format when the word-wise CRC calculation is employed. Two strategies for dummy padding are further proposed:

Strategy 1: padding with some zero-valued octets before the prefix of the processed message for the transmission side; and Strategy 2: padding with some zero-valued octets after the suffix of the processed message for the reception side.

In the word-wise case, no matter what the length of a frame is, they can be classified in accordance with their length into two types: 2n and 2n+1. If the Strategy 1 is adopted, the initial values of the flip-flops will vary with the length type as listed in

TABLE 1

| Length type | Padding number | C(0) | C(1) | C(2) |
|---|---|---|---|---|
| 2n + 1 | 1 | 00 ff 00 00 | ff ff 00 00 | ff 00 00 00 |
| 2n | 2 | 00 00 00 00 | ff ff 00 00 | ff ff 00 00 |

In order to complement the first 32 bits of the processed message, C(0), C(1) and C(2) vectors in Table 1 are added to the first 3 message blocks, and the influences of the C(i) on the calculated R(x) follow the relations $$R(1)=TC(0) \quad \text{(EQ-41a)}$$

$$R(2)=T(R(1)+C(1))=T^2\ C(0)+TC(1), \text{ and} \quad \text{(EQ-41b)}$$

$$R(3)=T(R(2)+C(2))=T^3\ C(0)T^2\ C(1)+T\ C(2), \quad \text{(EQ-41c)}$$

and the initial value of R(x) after 3 times of iterations is equivalent to the influences of C(i) on it, i.e., $$T^3\ R(0)=T^3\ C(0)+T^2\ C(1)+T\ C(2), \text{ or} \quad \text{(EQ-42a)}$$

$$R(0)=C(0)+T^{-1}\ C(1)+T^{-2}\ C(2) \quad \text{(EQ-42b)}$$

and summarized in

TABLE 2

| Length type | The initial value of R(0) |
|---|---|
| 2n + 1 | 0x9bf1a90f |
| 2n | 0x09b93859 |

For the Strategy 2, the resultant output of the flip-flops will vary with the length of the processed frame, and which implies, for examining the integrity of a received frame, that the output Pi will be compared with a specified pattern depending on the length type i as $$P_i=G^{8i}[0xc704dd7b]^T, \text{ for } i=1 \text{ and } 2, \quad \text{(EQ-43)}$$

and listed in

TABLE 3

| Length type | Padding number | Pattern (P$_i$) |
|---|---|---|
| 2n + 1 | 1 | 0x4710bb9c |
| 2n | 2 | 0x3a7abc72 |

Doubleword-Wise CRC 32

When the message is inputted in doubleword-wise form at a time, the input message and calculated remainder vectors are $$M_{32}(k)=[m_k^{31}\ m_k^{30} \ldots m_k^0]_{1\times 32}^T, \text{ and} \quad \text{(EQ-44a)}$$

$$R(k)=[r_k^{31}\ r_k^{30} \ldots r_k^0]_{1\times 32}^T. \quad \text{(EQ-44b)}$$

Figure 8:
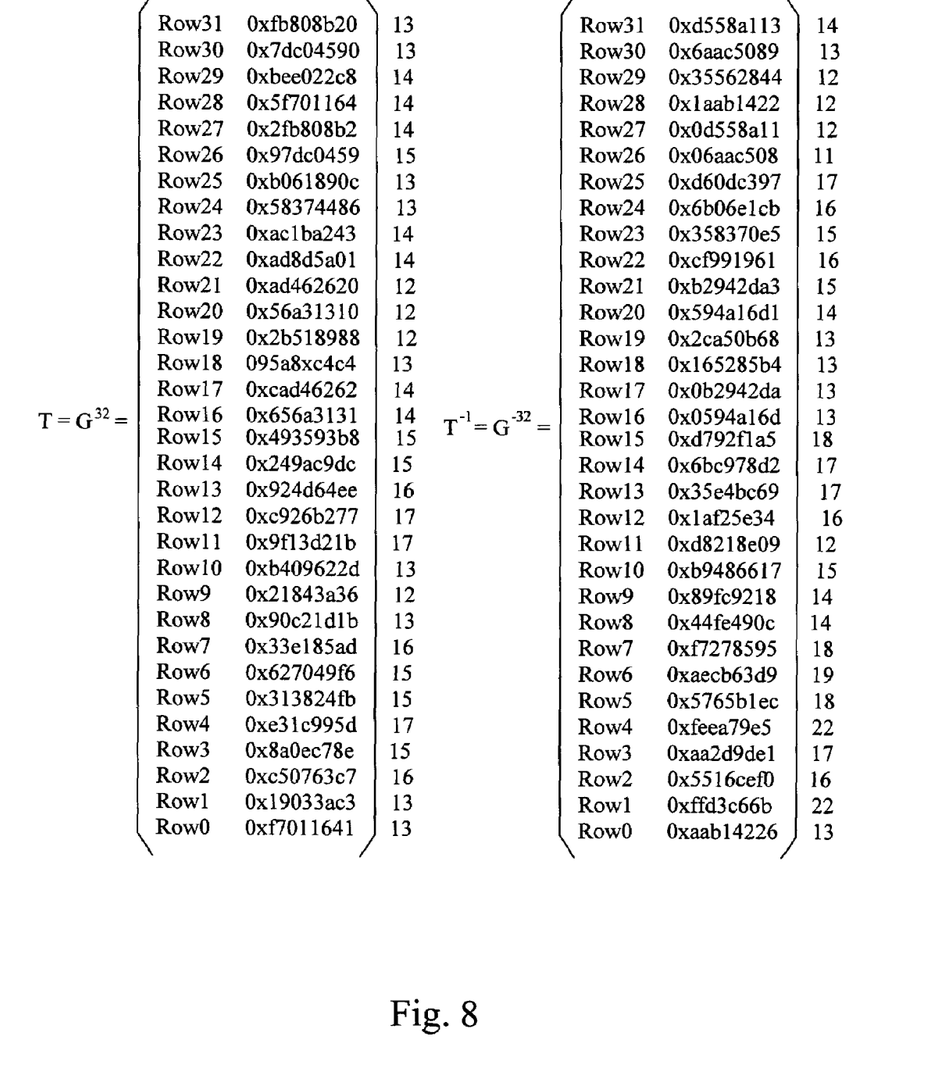
FIG. 8 shows the mapping matrix and its inverse for doubleword-wise CRC32 generations.
Figure 9:
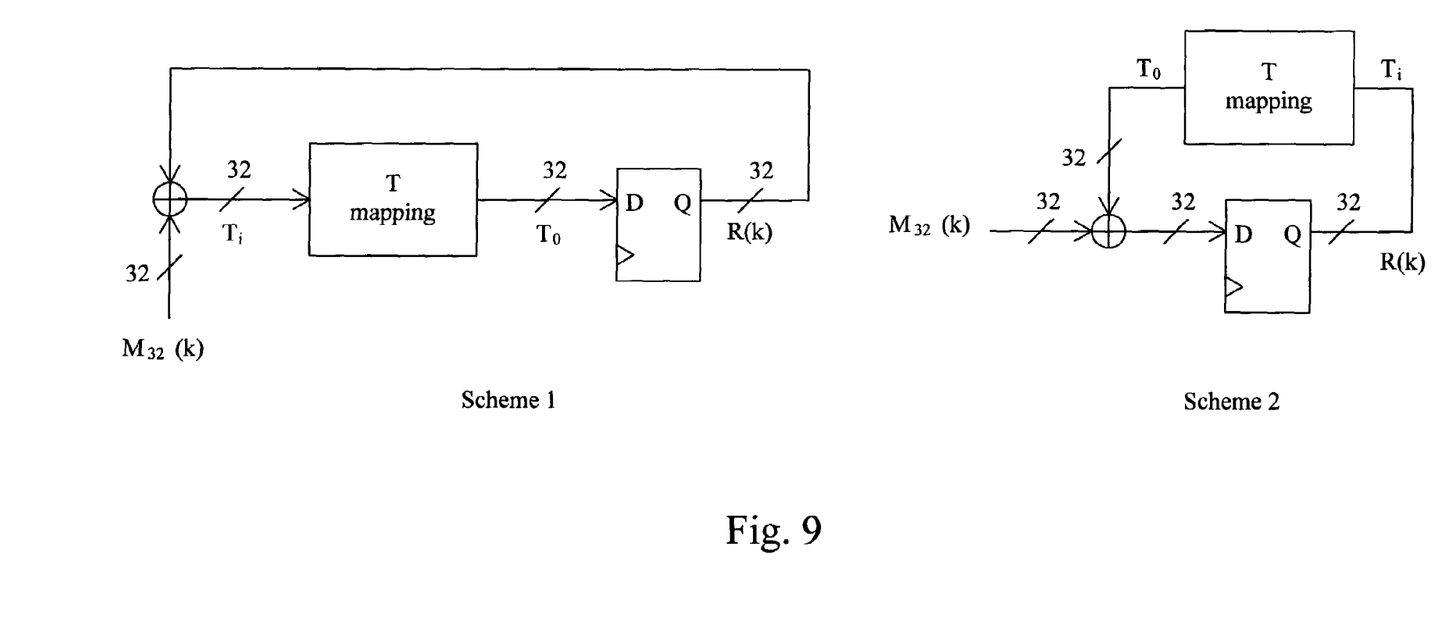
FIG. 9 shows the circuitries for doubleword-wise CRC32 generations.

Similar to the byte-wise case, the recursive equation R(k) for the Scheme 1 and 2 are $$R(k+1)=T(R(k)+M_{32}(k)), \text{ and} \quad \text{(EQ-45a)}$$

$$R(k+1)=T\ R(k)+M_{32}(k), \quad \text{(EQ-45b)}$$

where the matrix T is defined in FIG. 8, and the corresponding circuitries are shown in FIG. 9.

For the initial value of the flip-flops in the Scheme 2 in the above description, it can be derived by $$G^{32}R(0) = [0x\textit{ffffffff}]^T \qquad \text{(EQ-46a)}$$

$$R(0) = (G^{32})^{-1}[0x\textit{ffffffff}]^T \qquad \text{(EQ-46b)}$$

$$= [0x46af6449]^T$$

Again, no matter what the length of a frame is, they can be classified into 4 types: 4n, 4n+1, 4n+2 and 4n+3.

When the Strategy 1 is adopted, the initial values of the flip-flops will vary with the length type as denoted in

TABLE 4

| Length type | Padding number | C(0) | C(1) |
|---|---|---|---|
| 4n + 3 | 1 | 00 ff ff ff | ff 00 00 00 |
| 4n + 2 | 2 | 00 00 ff ff | ff ff 00 00 |
| 4n + 1 | 3 | 00 00 00 ff | ff ff ff 00 |
| 4n | 4 | 00 00 00 00 | ff ff ff ff |

The recursive equations are $$R(1)=TC(0), \text{ and} \qquad \text{(EQ-47a)}$$

$$R(2)=T(R(1)+C(1))=T^2C(0)+TC(1) \qquad \text{(EQ-47b)}$$

Let the initial values of the flip-flops be R(0), so that $$T^2R(0)=T^2C(0)+TC(1), \text{ or} \qquad \text{(EQ-48a)}$$

$$R(0)=C(0)+T^{-1}C(1), \qquad \text{(EQ-48b)}$$

and R(0) is listed in

TABLE 5

| Length type | The initial value of R(0) |
|---|---|
| 4n + 3 | 0x9bf1a90f |
| 4n + 2 | 0x09b93859 |
| 4n + 1 | 0x816474c5 |
| 4n | 0x46af6449 |

In the strategy 2, the resultant output of the flip-flops will vary with the length of the processed frame, which result implies, for examining the integrity of a received frame, the output Pi is compared with a specified pattern depending on the length type i, in the following rule $$P_i=G^{8i}[0xc704dd7b]^T, \text{ for } i=1, 2, 3 \text{ and } 4, \qquad \text{(EQ-49)}$$

and the pattern in

TABLE 6

| Length type | Padding number | Pattern ($P_i$) |
|---|---|---|
| 4n + 3 | 1 | 0x4710bb9c |
| 4n + 2 | 2 | 0x3a7abc72 |
| 4n + 1 | 3 | 0x8104c946 |
| 4n | 4 | 0x69044bb59 |

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A parallelized CRC calculation method for a message, comprising the steps of:
    preparing a generator matrix representing a Linear Feedback Shift Register (LFSR) corresponding to a form for linearly mapping an input vector to a remainder vector;
    arranging the message inputted in the form to the input vector;
    multiplying the generator matrix to the input vector derived from the message; and
    producing a CRC result.

2. A method according to claim 1, wherein the LFSR is configured for the message to be shifted thereinto from a MSB side.

3. A method according to claim 1, wherein the LFSR is configured for the message to be shifted thereinto from a LSB side.

4. A method according to claim 1, wherein the form is a byte-wise form.

5. A method according to claim 1, wherein the form is a word-wise form.

6. A method according to claim 5, wherein the step of arranging the message to the input vector comprises padding the message with one or more dummies.

7. A method according to claim 5, further comprising initiating the LFSR with a specific value.

8. A method according to claim 7, further comprising identify a length type of the message and determining the specific value in accordance with the length type.

9. A method according to claim 5, further comprising comparing the CRC result with a specific pattern.

10. A method according to claim 9, further comprising identify a length type of the message and determining the specific pattern in accordance with the length type.

11. A method according to claim 1, wherein the form is a doubleword-wise form.

12. A method according to claim 11, wherein the step of arranging the message to the input vector comprises padding the message with one or more dummies.

13. A method according to claim 11, further comprising initiating the LFSR with a specific value.

14. A method according to claim 13, further comprising identifying a length type of the message and determining the specific value in accordance with the length type.

15. A method according to claim 11, further comprising comparing the CRC result with a specific pattern.

16. A method according to claim 15, further comprising identifying a length type of the message and determining the specific pattern in accordance with the length type.

17. A method according to claim 1, wherein the step of multiplying the generator matrix to the input vector comprises performing an iteration procedure between the remainder vector and the input vector.

18. A parallelized CRC calculation system for verifying a message, comprising:
    means for arranging the message inputted in a form to an input vector;
    a generator matrix representing a Linear Feedback Shift Register (LFSR) corresponding to the form for linearly mapping the input vector to a remainder vector; and
    means for producing a CRC result.

19. A system according to claim 18, wherein the LFSR is configured for the message to be shifted thereinto from a MSB side.

20. A system according to claim 18, wherein the LFSR is configured for the message to be shifted thereinto from a LSB side.

21. A system according to claim 18, wherein the form is a byte-wise form.

22. A system according to claim 18, wherein the form is a word-wise form.

23. A system according to claim 22, further comprising one or more dummies for padding the message thereto.

24. A system according to claim 22, further comprising a specific value for initiating the LFSR therewith.

25. A system according to claim 24, further comprising means for identifying a length type of the message and determining the specific value in accordance with the length type.

26. A system according to claim 22, further comprising means for comparing the CRC result with a specific pattern.

27. A system according to claim 26, further comprising means for identifying a length type of the message and determining the specific pattern in accordance with the length type.

28. A system according to claim 18, wherein the form is a doubleword-wise form.

29. A system according to claim 28, further comprising one or more dummies for padding the message thereto.

30. A system according to claim 28, further comprising a specific value for initiating the LFSR therewith.

31. A system according to claim 30, further comprising means for identifying a length type of the message and determining the specific value in accordance with the length type.

32. A system according to claim 28, further comprising means for comparing the CRC result with a specific pattern.

33. A system according to claim 32, further comprising means for identifying a length type of the message and determining the specific pattern in accordance with the length type.

* * * * *